US010133325B2

(12) United States Patent
Helberg et al.

(10) Patent No.: US 10,133,325 B2
(45) Date of Patent: Nov. 20, 2018

(54) ENHANCED CONVECTIVE COOLING SYSTEM

(71) Applicant: Dell Products L.P., Round Rock, TX (US)

(72) Inventors: Christopher Michael Helberg, Austin, TX (US); Austin Michael Shelnutt, Leander, TX (US); Travis Christian North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 309 days.

(21) Appl. No.: 15/009,536

(22) Filed: Jan. 28, 2016

(65) Prior Publication Data

US 2017/0220083 A1     Aug. 3, 2017

(51) Int. Cl.
   *H05K 7/20*     (2006.01)
   *G06F 1/20*     (2006.01)
   *G01F 1/20*     (2006.01)

(52) U.S. Cl.
   CPC .............. *G06F 1/206* (2013.01); *G01F 1/20* (2013.01); *H05K 7/20* (2013.01); *H05K 7/20127* (2013.01)

(58) Field of Classification Search
   CPC ........ H05K 7/20; H05K 7/20127; G01F 1/20; G01F 1/206
   See application file for complete search history.

(56) References Cited

U.S. PATENT DOCUMENTS

| 7,633,751 | B2 * | 12/2009 | Shinotou ............ H05K 7/20972 349/58 |
| 8,451,604 | B2 * | 5/2013 | Bhattacharya ..... H05K 7/20145 361/690 |
| 8,553,411 | B2 * | 10/2013 | Abraham .................. G06F 1/20 361/679.47 |
| 9,173,320 | B2 * | 10/2015 | Alshinnawi ........ H05K 7/20145 |
| 9,226,426 | B2 * | 12/2015 | Bodenweber ...... H05K 7/20127 |
| 9,261,282 | B2 * | 2/2016 | Hadzidedic .............. F24D 5/02 |
| 2011/0105015 | A1 * | 5/2011 | Carlson ............. H05K 7/20127 454/253 |

* cited by examiner

*Primary Examiner* — Son Mai
(74) *Attorney, Agent, or Firm* — Haynes and Boone, LLP

(57) ABSTRACT

An airflow control system includes a chassis defining a chassis housing that includes at least one airflow inlet and an airflow outlet. A cooled device is located in the chassis housing between the at least one airflow inlet and the airflow outlet. A convection enhancing heat element is located in the chassis housing between the cooled device and the airflow outlet. A controller is coupled to the convection enhancing heat element and configured to activate the convection enhancing heat element such that a convective airflow through the chassis housing is increased.

17 Claims, 7 Drawing Sheets

ENHANCED CONVECTIVE COOLING SYSTEM

BACKGROUND

The present disclosure relates generally to information handling systems, and more particularly to an enhanced convective cooling system for an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the desire continues for information handling systems to steadily increase in performance and efficiency, the hardware components included in the information handling system produce more and more heat while requiring more and more efficient cooling systems. Some of the highest power consuming and primary failure items in information handling system cooling systems are the cooling fans. Thus, one option in maximizing reliability and efficiency of a cooling system for an information handling system is to reduce the number of cooling fans utilized in the information handling system.

One solution to this issue is to provide a natural convection cooling system. In natural convection or free convection cooling system, the density of a cooling fluid (e.g., air) may be decreased through an increase in temperature that is a result of heat transferred from a heat producing component of an information handling system to that fluid. That increased temperature, lower density fluid (i.e., heated, lower density air) will then rise against gravity due to buoyancy forces, thus moving the heat away from the heat producing component. However, such natural convection cooling is only able to produce heat transfer that is proportionate to the temperature (and thus fluid density) differential between the heat producing component and the fluid. Therefore, conventional natural convection cooling systems are capable of moving significantly less air than a forced air convection cooling system that utilizes cooling fans and, as such, natural convection cooling systems typically do not provide sufficient cooling to allow their use in many information handling systems.

Accordingly, it would be desirable to provide an improved natural convection cooling system.

SUMMARY

According to one embodiment, an airflow control system includes a chassis defining a chassis housing that includes at least one airflow inlet and an airflow outlet; a cooled device located in the chassis housing between the at least one airflow inlet and the airflow outlet; a convection enhancing heat element located in the chassis housing between the cooled device and the airflow outlet; and a controller that is coupled to the convection enhancing heat element and configured to activate the convection enhancing heat element such that a convective airflow through the chassis housing is increased.

DETAILED DESCRIPTION

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
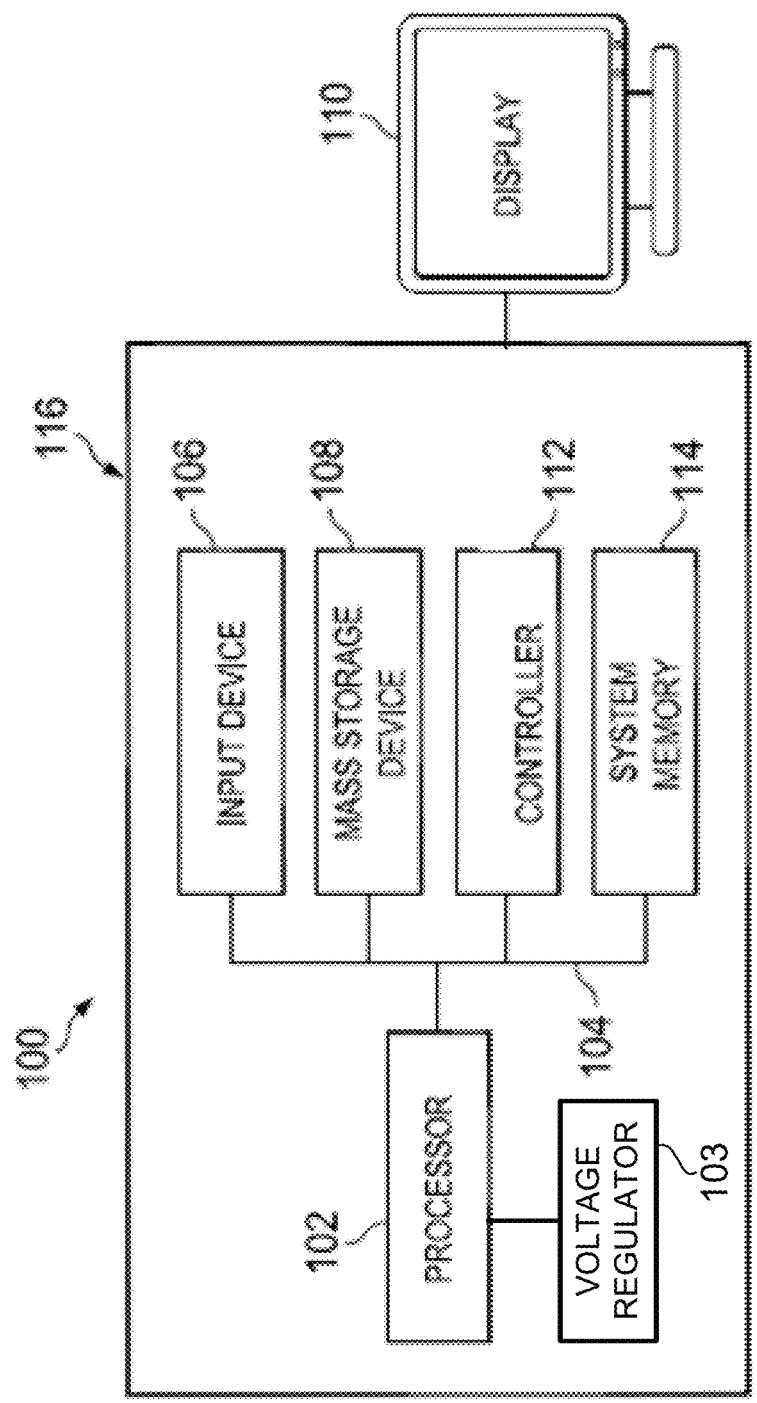
FIG. 1 is a schematic view illustrating an embodiment of an information handling system (IHS).

In one embodiment, IHS 100, FIG. 1, includes a processor 102, which is connected to a voltage regulator 103 and a bus 104. Voltage regulator 103 regulates a level of power supply for processor 102. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102.

Examples of mass storage devices may include hard discs, optical disks, magneto-optical discs, solid-state storage devices, and/or a variety other mass storage devices known in the art. IHS 100 further includes a display 110, which is coupled to processor 102 by a controller 112 that may be a video controller. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
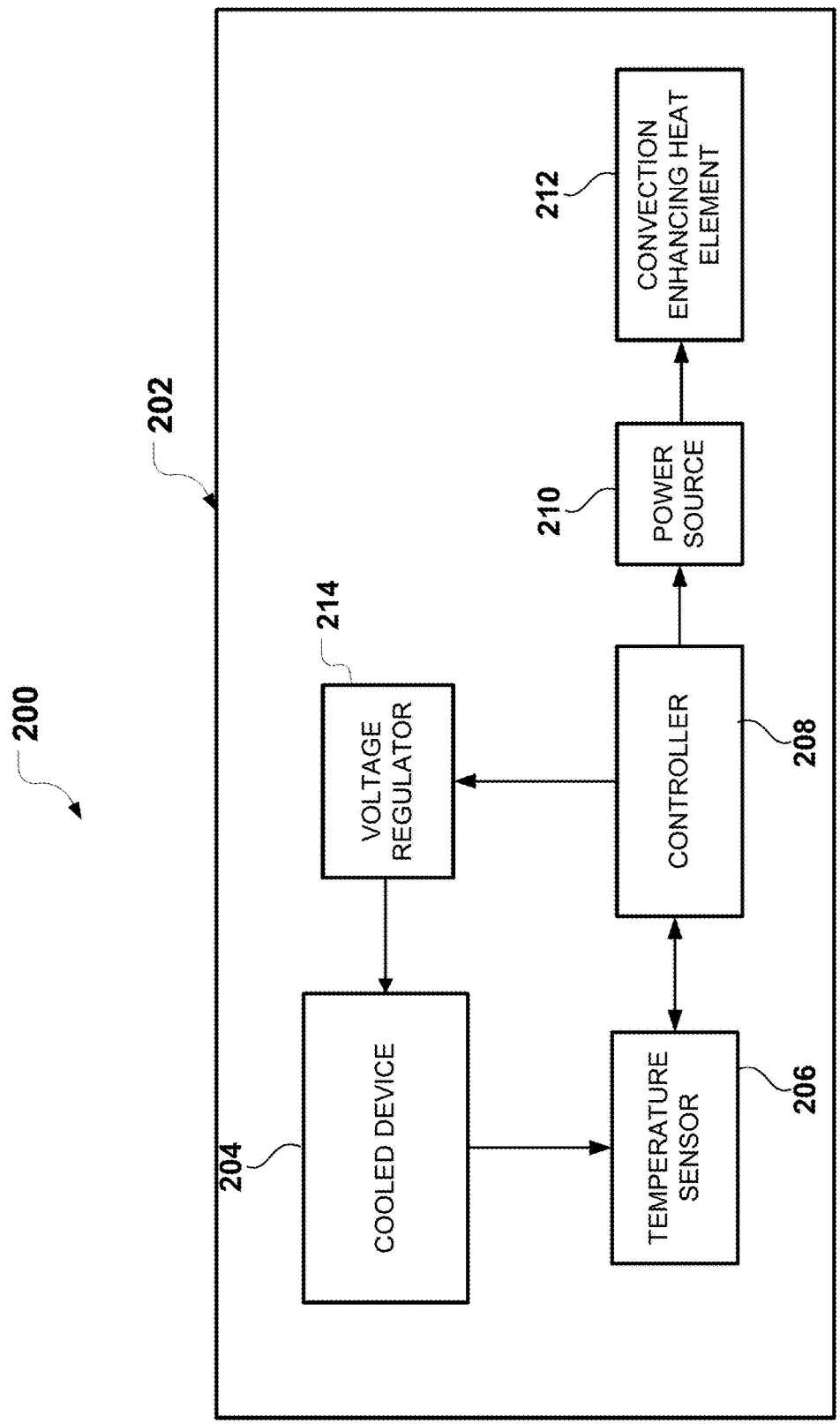
FIG. 2 is a schematic view illustrating an embodiment of an enhanced convective cooling system.

Referring now to FIG. 2, a schematic view illustrating an embodiment of an enhanced convective cooling system 200 is illustrated that includes a chassis 202. In an embodiment, the enhanced convective cooling system 200 may be a part of the IHS 100 discussed above with reference to FIG. 1, and/or may include some or all of the components of the IHS 100. The chassis 202 defines a chassis housing that includes at least one airflow inlet and an airflow outlet, and a cooled device 204 is located in the chassis housing between the at least one airflow inlet and the airflow outlet, discussed in further detail below. A temperature sensor 206 is located in the chassis 202, coupled to the cooled device 204 and configured to indicate a temperature of the cooled device 204. A controller 208 is coupled to the temperature sensor 206 and to a power source 210. The power source 210 is coupled to a convection enhancing heat element 212. In an embodiment, the convection enhancing heat element 212 may be provided by a dedicated (e.g., non-computing device) heat element that is configured to produce heat in response to an electrical current that may greatly exceed the heat produced by computing devices in the chassis 202 such as the processing system discussed below. However, a variety of other heat producing subsystems may be provided as the convection enhancing heat element 212 while remaining within the scope of the present disclosure. The convection enhancing heat element 212 is located in the chassis 202 gravitationally above the cooled device 204 during system operations, and the controller 208 is configured to activate the convection enhancing heat element 212 (e.g., by enabling power from the power source 210 to the convection enhancing heat element 212) based on the temperature of the cooled device 204 indicated by the temperature sensor 206 in order to enhance convective heat transfer from the cooled device 204, discussed in further detail below. In the illustrated embodiment, the chassis 202 includes a voltage regulator 214 coupled to each of the cooled device 204 and the controller 208. In an embodiment, the enhanced convective cooling system 200 may be provided in variety of information handling systems such as a desktop computing system, laptop/notebook computing systems, tablet computing systems, mobile phones, Internet Of Things (IOT) devices, sensors devices, and/or other computing systems known in the art. In an embodiment, the cooled device 204 may be a processing system, a memory system, a communication system, a storage system, and/or a variety of other computing devices known in the art.

Figure 3:
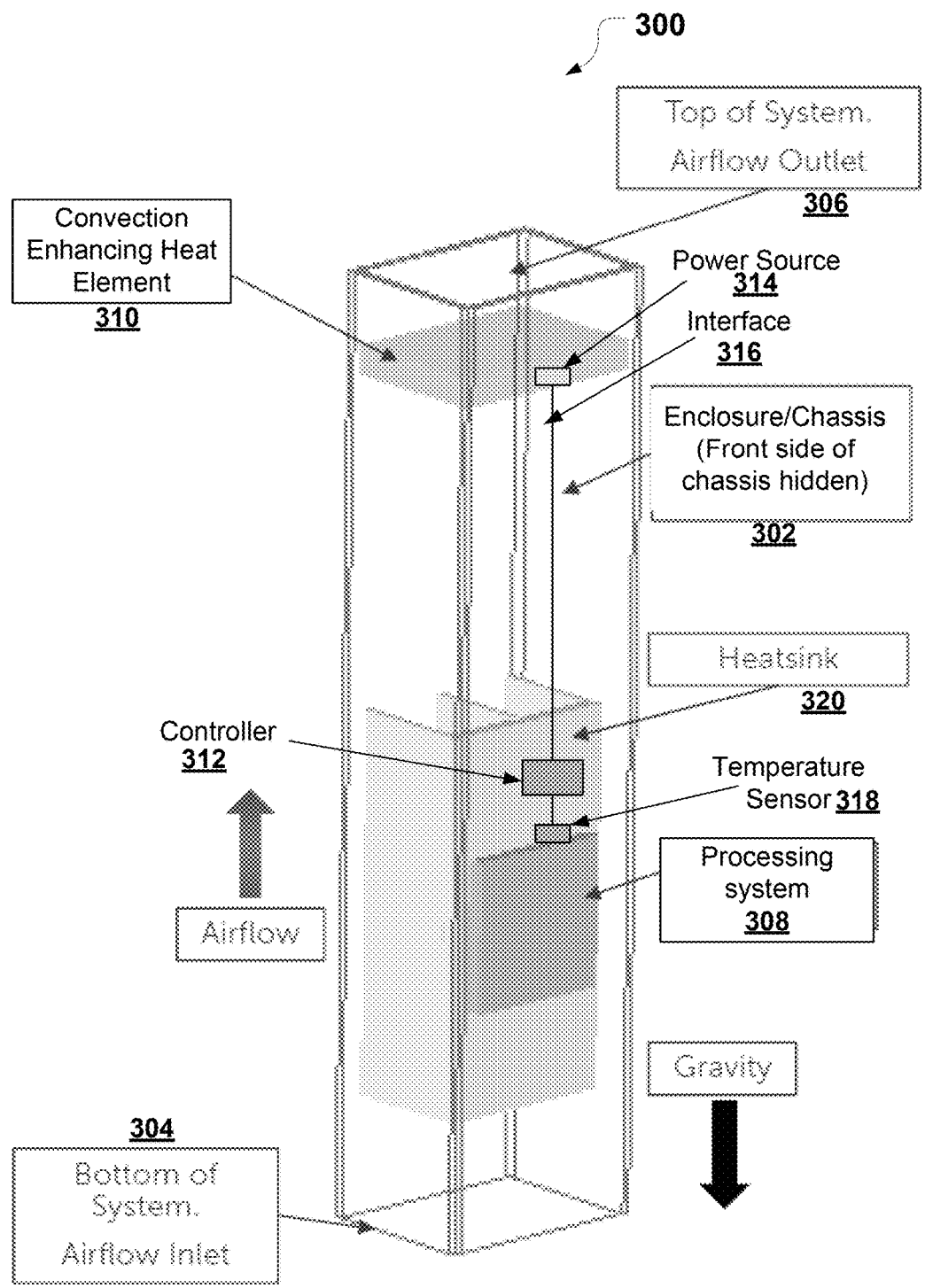
FIG. 3 is a perspective view illustrating an embodiment of an IHS cooling system that uses the enhanced convective cooling system of FIG. 2.

Referring now to FIG. 3, an embodiment of an IHS cooling system 300 is illustrated. The IHS cooling system 300 may be the enhanced convective cooling system 200 discussed above with reference to FIG. 2, and thus may be provided in the IHS 100 discussed above with reference to FIG. 1, and/or may include some or all of the components of the IHS 100. The IHS cooling system 300 includes a chassis 302 that defines an airflow channel along its length and that includes an airflow inlet 304 and an airflow outlet 306 that is located opposite the chassis 302 from the airflow inlet. A processing system 308, which may be the cooled device 204 discussed above with reference to FIG. 2, is housed in the chassis 302 and located in the airflow channel. A convection enhancing heat element 310 is housed in the chassis 302 and positioned opposite the processing system 308 from the airflow inlet 304 to the airflow channel. As discussed above, the convection enhancing heat element 310 may be provided by a dedicated (e.g., non-computing device) heat element that is configured to produce heat in response to an electrical current that may greatly exceed the heat produced by the processing system 308. For example, the convection enhancing heat element 310 may be provided by a resistance heating coil, a component that operates at a higher operating temperature than the cooled device 204 (and which may be cooled by a dedicated heat sink and/or outflow air plenum), and/or a variety of other heat producing subsystems while remaining within the scope of the present disclosure.

As illustrated in FIG. 3 by the arrow indicating the direction of gravity, the convection enhancing heat element 310 is located gravitationally above the processing system 308 (i.e., a cooled device) during system operations in order to enhance convective heat transfer, discussed in further detail below. A controller 312 is coupled to the processing system 308 and a power source 314 of the convection enhancing heat element 310 via an interface connection 316 that may run through the airflow channel of the chassis 302, or that may be embedded in the chassis 302. The controller 312 is also connected to a temperature sensor 318 that is coupled to the processing system 308. In the illustrated embodiment, the IHS cooling system 300 further includes a heat sink 320 that is housed in the chassis 302 and that includes heat sink elements that extend across the airflow channel, while the processing system 308 is mounted to the heat sink 318. In the embodiment of FIG. 3, a simplified embodiment of the IHS cooling system 300 is illustrated and described that may be advantageous for use in Internet of Things devices and/or other sensor/information reporting devices based on its relatively small form factor and ability to sufficiently cool the processing system 308 as discussed below. While not illustrated or described in detail, the chassis 308 may include a variety of mounting features (e.g., clips, adhesives, fasteners, electrical and/or computing connectors, etc.) for coupling the IHS cooling system 300 to any device, surface, and/or other entity that utilizes the processing system 308 (or information provided by the processing system 308), or from which information from the processing system 308 is desired.

Figure 4:
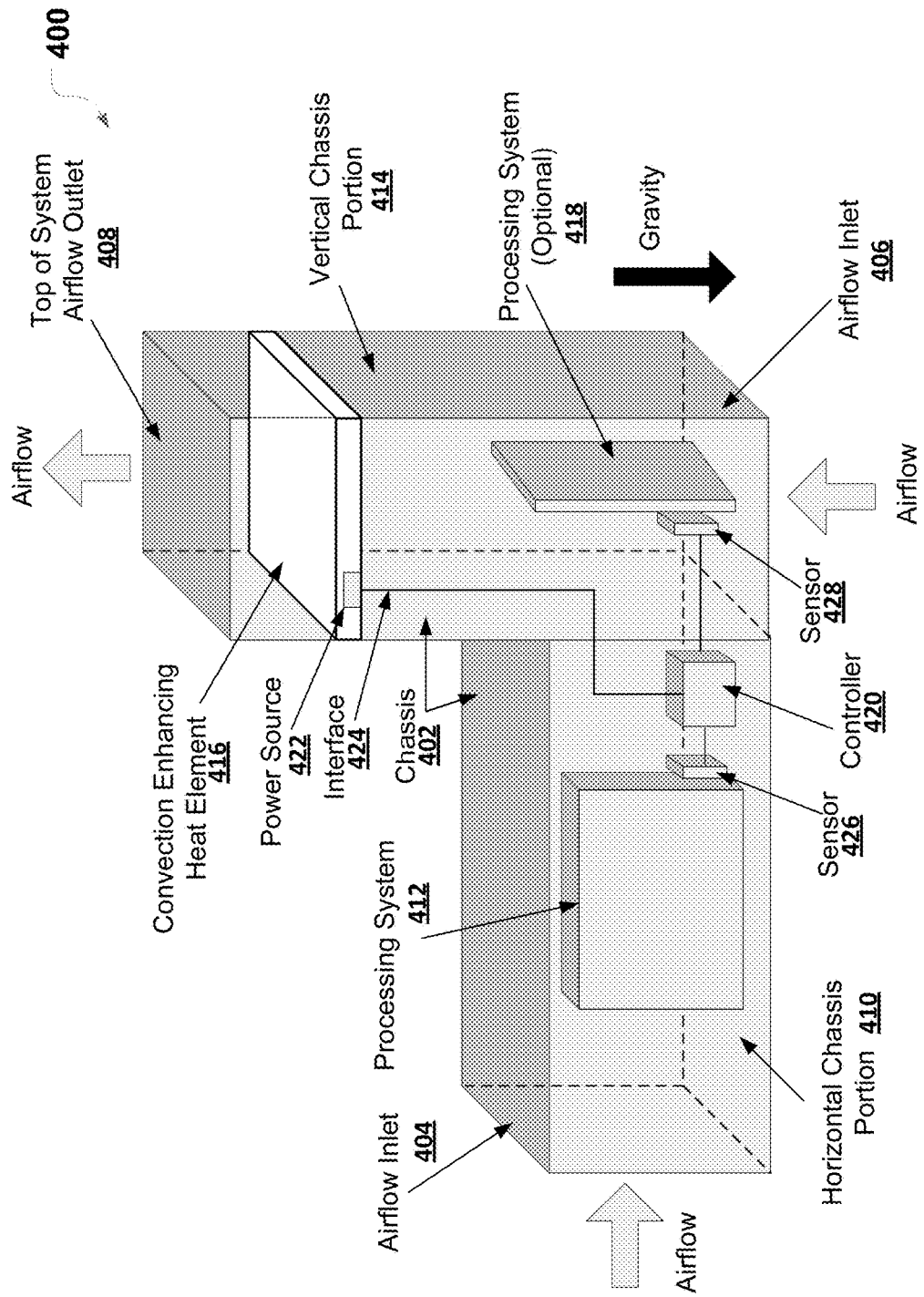
FIG. 4 is a perspective view illustrating another embodiment of an IHS cooling system that uses the enhanced convective cooling system of FIG. 2.

Referring now to FIG. 4, an embodiment of an IHS cooling system 400 is illustrated that provides some alternative features compared to the IHS cooling system 300 of FIG. 3. The IHS cooling system 400 may be the enhanced convective cooling system 200 discussed above with reference to FIG. 2, and thus may be provided in the IHS 100 discussed above with reference to FIG. 1, and/or include some or all of the components of the IHS 100. The IHS cooling system 400 includes a chassis 402 defining at least one airflow channel that includes an airflow inlet 404, an airflow inlet 406 and an airflow outlet 408. The chassis 402 includes a first, horizontal chassis portion 410 that includes the airflow inlet 404 and defines a first airflow channel that houses a processing system 412. The chassis 402 also includes a second, vertical chassis portion 414 that includes the airflow inlet 406 and the airflow outlet 408, and defines a second airflow channel that is in fluid communication with the first airflow channel and that houses a convection enhancing heat element 416 adjacent the airflow outlet 408. The first, horizontal chassis portion 410 provides the first airflow channel in a substantially horizontal orientation and the second, vertical chassis portion 414 provides the second airflow channel in a substantially vertical orientation during IHS operations. In the illustrated embodiment, the second chassis portion 414 also houses a processing system 418, and additional or fewer processing systems or other heat producing components may be added to or removed from the chassis 402 as desired. As discussed above, the convection enhancing heat element 416 may be provided by a dedicated (e.g., non-computing device) heat element that is configured to produce heat in response to an electrical current that may greatly exceed the heat produced by the processing systems 412 and 418. However, a variety of other heat producing subsystems may be provided as the convection enhancing heat element 416, including computing system components that produce sufficient heat to provide the benefits discussed below, while remaining within the scope of the present disclosure.

As illustrated in FIG. 4 by the arrow indicating the direction of gravity, the convection enhancing heat element 416 is located gravitationally above the processing system 412 (i.e., a cooled device) and the processing system 418 (i.e., another cooled device) during system operations in order to enhance convective heat transfer, discussed in further detail below. A controller 420 is coupled to the processing system 412 (and optionally to the processing system 418) and a power source 422 of the convection enhancing heat element 416 (e.g., via interface connection 424). The controller 420 is also connected to a temperature sensor 426 coupled to the processing system 412, and may be further connected to a temperature sensor 428 coupled to the processing system 418.

While a few specific examples have been provided in FIGS. 3 and 4, a wide variety of modifications to the embodiments discussed above are envisioned as falling within the scope of the present disclosure. For example, the chassis may house any number of cooled devices and convection enhancing heat elements, and may define any number of different sized and dimensioned airflow channels that include one or more airflow inlets and airflow outlets. As discussed below, the positioning of the convection enhancing heat element(s) gravitationally above the cooled device(s) and between the cooled device(s) and the airflow outlet(s) will enhance airflow past the cooled device(s) when the convection enhancing heat element(s) are activated. Thus, the enhanced convection cooling system may be provided in relatively small devices that may be attached to other devices or entities, or provided in relatively large devices such as desktop computing devices, servers, storage system, and/or any other computing device known in the art that will benefit from the enhanced convection cooling taught herein.

Figure 5:
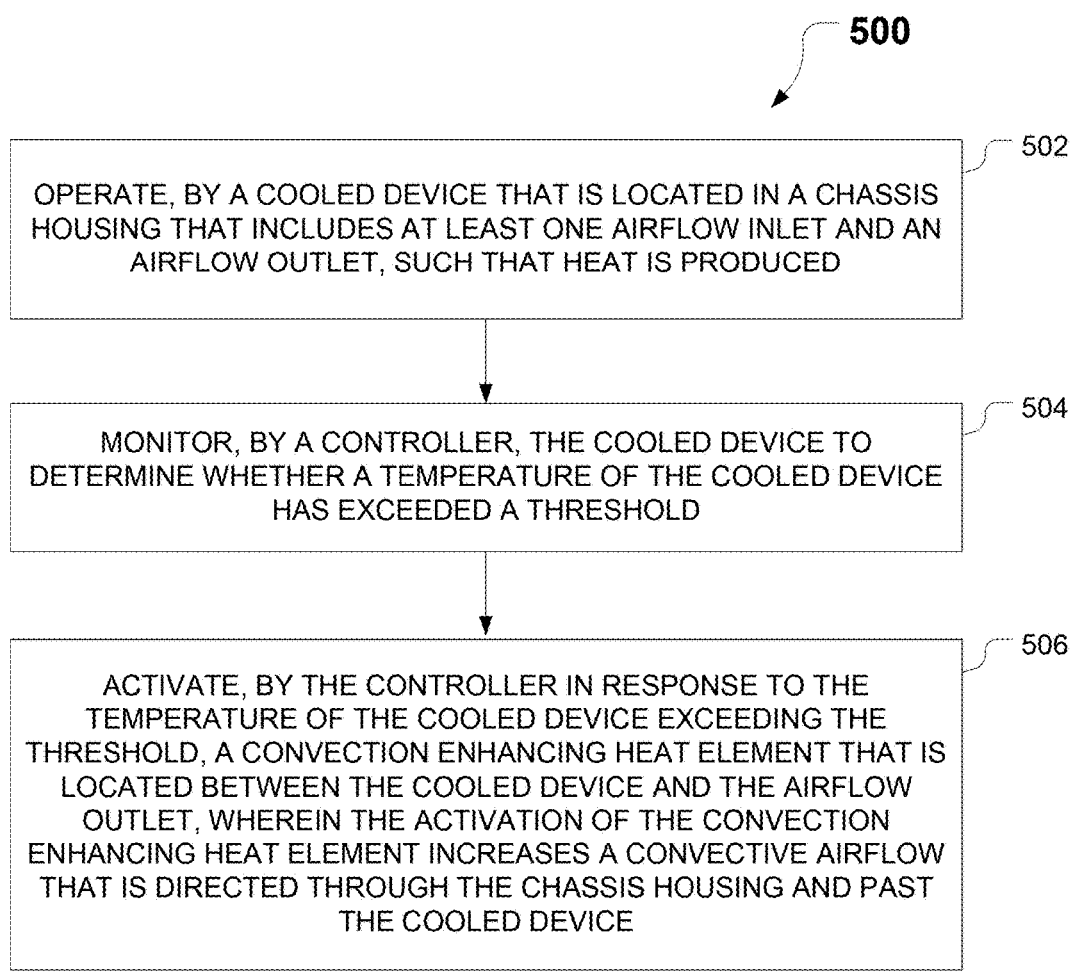
FIG. 5 is a flow chart illustrating an embodiment of a method for providing enhanced convective cooling.

Referring now to FIG. 5, an embodiment of a method 500 for airflow control is illustrated. As discussed below, the systems and methods of the present disclosure provide a convection enhancing heat element located between cooled device(s) and an airflow outlet that, when activated to produce heat, enhance the convective airflow through a chassis in order to provide enhanced convective cooling to the cooled devices. As such, cooled devices that have relatively high cooling requirements may be cooled via convection and without the use of fan devices that increase power consumption, noise, and maintenance requirements of the system.

The method 500 begins at block 502 by operating a cooled device, which is located in a chassis housing that includes at least one airflow inlet and an airflow outlet, such that heat is produced. In the embodiment of FIG. 1, the cooled device is the processor 102 or the system memory 114 located in the chassis 116, and that processor 102 and system memory 114 may be operated such that heat is produced. In the embodiment of FIG. 2, the cooled device 204 of the enhanced convective cooling system 200 is located in the chassis 202 that defines a chassis housing that includes at least one airflow inlet and an airflow outlet, and that cooled device 204 may be operated such that heat is produced. In the embodiment of FIG. 3, the cooled device is the processing system 308 that is located in the chassis 302 that includes the airflow inlet 304 and the airflow outlet 306, and that processing system 308 may be operated such that heat is produced. In the embodiment of FIG. 4, the cooled device is the processing system 412 that is located in the first, horizontal chassis portion 410 of the chassis 402 that includes the airflow inlet 404, and/or the cooled device is the processing system 418 that may be located in the second, vertical chassis portion 414 of the chassis 402 that includes the airflow inlet 406 and the airflow outlet 408, and the processing system 412 and/or the processing system 418 can be operated such that heat is produced.

The method 500 then proceeds to block 504 where a controller monitors the cooled device to determine whether a temperature of the cooled device has exceeded a threshold. In the embodiment of FIG. 1, the controller 112 can be configured to monitor a temperature of the processor 102 and determine whether the temperature of the processor 102 has exceeded a threshold. Alternatively, or additionally, the controller 112 can be configured to monitor a temperature of the system memory 114 and determine whether the temperature of the system memory 114 has exceeded a threshold. In the embodiment of FIG. 2, the controller 208 monitors the cooled device 204 to determine whether a temperature of the cooled device 204 has exceeded a threshold. The temperature sensor 206 coupled to the cooled device 204 can measure the temperature of the cooled device 204, and provide an indication about the measured temperature of the cooled device 204 to the controller 208. Based on the indication about the measured temperature of the cooled device 204 provided by the temperature sensor 206, the controller 208 can determine whether the temperature of the cooled device 204 has exceeded the threshold. In the embodiment of FIG. 3, the controller 312 monitors the processing system 308 to determine whether a temperature of the processing system 308 has exceeded a threshold. The temperature sensor 318 coupled to the processing system 308 can measure a temperature of the processing system 308, and provide an indication about the measured temperature of the processing system 308 to the controller 312. Based on the indication about the measured temperature of the processing system 308 provided by the temperature sensor 318, the controller 312 can determine whether the temperature of the processing system 308 has exceeded the threshold.

In the embodiment of FIG. 4, the controller 420 monitors the processing system 412 to determine whether a temperature of the processing system 412 has exceeded a threshold. The temperature sensor 426 coupled to the processing system 412 can measure a temperature of the processing system 412, and provide an indication about the measured temperature of the processing system 412 to the controller 420. Based on the indication about the measured temperature of the processing system 412 provided by the temperature sensor 426, the controller 420 can determine whether the temperature of the processing system 412 has exceeded the threshold. Alternatively, or additionally, the controller 420 monitors the processing system 418 to determine whether a temperature of the processing system 418 has exceeded a threshold. The temperature sensor 428 coupled to the processing system 418 may measure a temperature of the processing system 418, and provide an indication about the measured temperature of the processing system 418 to the controller 420. Based on the indication about the measured temperature of the processing system 418 provided by the temperature sensor 428, the controller 420 may determine whether the temperature of the processing system 418 has exceeded the threshold.

The method 500 then proceeds to block 506 where the controller, in response to the temperature of the cooled device exceeding the threshold, activates a convection enhancing heat element that is located between the cooled device and the airflow outlet, and the activation of the convection enhancing heat element increases a convective airflow that is directed through the chassis housing and past the cooled device. In the embodiment of FIG. 1, the voltage regulator 103 may be configured as the convection enhancing heat element, and the voltage regulator 103 can be configured to produce temperatures that are higher than temperatures produced by the processor 102 and the system memory 114 when activated. The controller 112, in response to the temperature of the processor 102 and/or the temperature of the system memory 114 exceeding the threshold as discussed above, may activate the voltage regulator 103 in order to enable an increase of heat generated by the voltage regulator 103. The voltage regulator 103 may be strategically located gravitationally above the processor 102 and the system memory 114 during system operations (i.e., the voltage regulator 103 may be positioned in the chassis 116 such that a known orientation of the chassis 116 provides the voltage regulator 103 at a higher elevation than the processor 102 and the system memory 114). The increase of heat generated by the voltage regulator 103 operates to increase a naturally convective airflow that is directed through the chassis 116 and past the processor 102 and the system memory 114, as the density of air in a vicinity of the voltage regulator 103 is decreased through an increase in temperature that is a result of heat transferred from the voltage regulator 103 to the air, and that lower density heated air in the vicinity of the voltage regulator 103 rises against gravity due to buoyancy forces, thus moving the heat away from the processor 102 and the system memory 114. Such enhanced convective cooling is able to produce a larger airflow though the chassis 116 and results in enhanced heat transfer that is proportionate to the temperature (and thus fluid density) differential between the voltage regulator 103 (the convection enhancing heat element in this example) and a cooler (and thus higher density) air at an airflow inlet of the chassis 116.

In the embodiment of FIG. 2, the convection enhancing heat element 212 can produce temperatures that are higher than temperatures produced by the cooled device 204 when activated. The controller 208, in response to the temperature of the cooled device 204 exceeding the threshold as discussed above, can activate the convection enhancing heat element 212 by enabling power from the power source 210 to the convection enhancing heat element 210. The convection enhancing heat element 212 can be strategically located gravitationally above the cooled device 204 during system operations (i.e., the convection enhancing heat element 212 may be positioned in the chassis 202 such that a known orientation of the chassis 202 provides the convection enhancing heat element 212 at a higher elevation than the cooled device 204). The increase of heat generated by the convection enhancing heat element 212 operates to increase a naturally convective airflow that is directed through the chassis 202 and past the cooled device 204, as the density of air in a vicinity of the convection enhancing heat element 212 is decreased through an increase in temperature that is a result of heat transferred from the convection enhancing heat element 212 to the air, and that lower density heated air in the vicinity of the convection enhancing heat element 212 then rises against gravity due to buoyancy forces, thus moving the heat away from the cooled device 204. Such enhanced convective cooling is able to produce a larger airflow through the chassis 202 and results in enhanced heat transfer that is proportionate to the temperature (and thus fluid density) differential between the convection enhancing heat element 212 and a cooler (and thus higher density) air at the airflow inlet of the chassis 202. Alternatively, similarly as discussed above with reference to FIG. 1, the voltage regulator 214 can be configured as a convection enhancing heat element able to produce temperatures than are higher than temperatures produced by the cooled device 204 when activated. The controller 208, in response to the temperature of the cooled device 204 exceeding the threshold as discussed above, may activate the voltage regulator 214 (e.g., by enabling more power to be supplied to the voltage regulator 214) in order to increase heat generated by the voltage regulator 214. The voltage regulator 214 may be strategically located gravitationally above the cooled device 204 during system operations as discussed above, and the increase of heat generated by the voltage regulator 214 may increase a naturally convective airflow that is directed through the chassis 202 and past the cooled device 204, thus enhancing the heat dissipation from the cooled device 204.

In the embodiment of FIG. 3, the convection enhancing heat element 310 is configured to produce temperatures that are higher than temperatures produced by the processing system 308 when activated. The controller 312, in response to the temperature of the processing system 308 exceeding the threshold as discussed above, can activate the convection enhancing heat element 310 by enabling power to the convection enhancing heat element 310 from the power source 314 coupled to the convection enhancing heat element 310 and the controller 312 (via the interface connection 316). The convection enhancing heat element 310 is strategically located gravitationally above the processing system 308 during system operations (i.e., the convection enhancing heat element 310 may be positioned in the chassis 302 such that a known orientation of the chassis 302 provides the convection enhancing heat element 310 at a higher elevation than the processing system 308, as illustrated in FIG. 3). The increase of heat generated by the convection enhancing heat element 310 increases a naturally convective airflow that is directed through the airflow inlet 304, the chassis 302, past the processing system 308 and to the airflow outlet 306, as a density of air in a vicinity of the convection enhancing heat element 310 is decreased through an increase in temperature that is a result of heat transferred from the convection enhancing heat element 310 to the air, and that lower density heated air in the vicinity of the convection enhancing heat element 310 rises against gravity due to buoyancy forces, thus moving the heat away from the processing system 308. Such enhanced convective cooling is able to produce a larger airflow through the chassis 302 and results in enhanced heat transfer that is proportionate to the temperature (and thus fluid density) differential between the convection enhancing heat element 310 and a cooler (and thus higher density) air at the airflow inlet 304 of the chassis 302.

In the embodiment of FIG. 4, the convection enhancing heat element 416 is configured to produce temperatures that are higher than temperatures produced by the processing system 412 and the processing system 418 when activated. The controller 420, in response to the temperature of the processing system 412 exceeding the threshold as discussed above, can activate the convection enhancing heat element 416 by enabling power to the convection enhancing heat element 416 from the power source 422 coupled to the convection enhancing heat element 416 and the controller 420 (via the interface connection 424). The convection enhancing heat element 416 is strategically located gravitationally above the processing system 412 and the processing system 418 during system operations (i.e., the convection enhancing heat element 416 may be positioned in the chassis 402 such that a known orientation of the chassis 402 provides the convection enhancing heat element 416 at a higher elevation than the processing system 412 and the processing system 418, as illustrated in FIG. 4). The increase of heat generated by the convection enhancing heat element 416 increases a naturally convective airflow that is directed through the airflow inlet 404, the horizontal chassis portion 410, past the processing system 412 and to the vertical chassis portion 414 and the airflow outlet 408. Further, the increase of heat generated by the convection enhancing heat element 416 increases another naturally convective airflow that is directed through the airflow inlet 406 and the vertical chassis portion 414, past the processing system 418 and to the airflow outlet 408. Similarly as discussed above, the increase of the naturally convective airflow is a result of the density of air in a vicinity of the convection enhancing heat element 416 being decreased through an increase in temperature that is a result of heat transferred from the convection enhancing heat element 416 to the air, and that lower density heated air in the vicinity of the convection enhancing heat element 416 rises against gravity due to buoyancy forces, thus moving the heat away from the processing system 412 and the processing system 418. Such enhanced convective cooling is able to produce a larger airflow through the chassis 402 and results in enhanced heat transfer that is proportionate to the temperature (and thus fluid density) differential between the convection enhancing heat element 416 and a cooler (and thus higher density) air at the airflow inlets 404 and 406 of the chassis 402.

Figure 6:
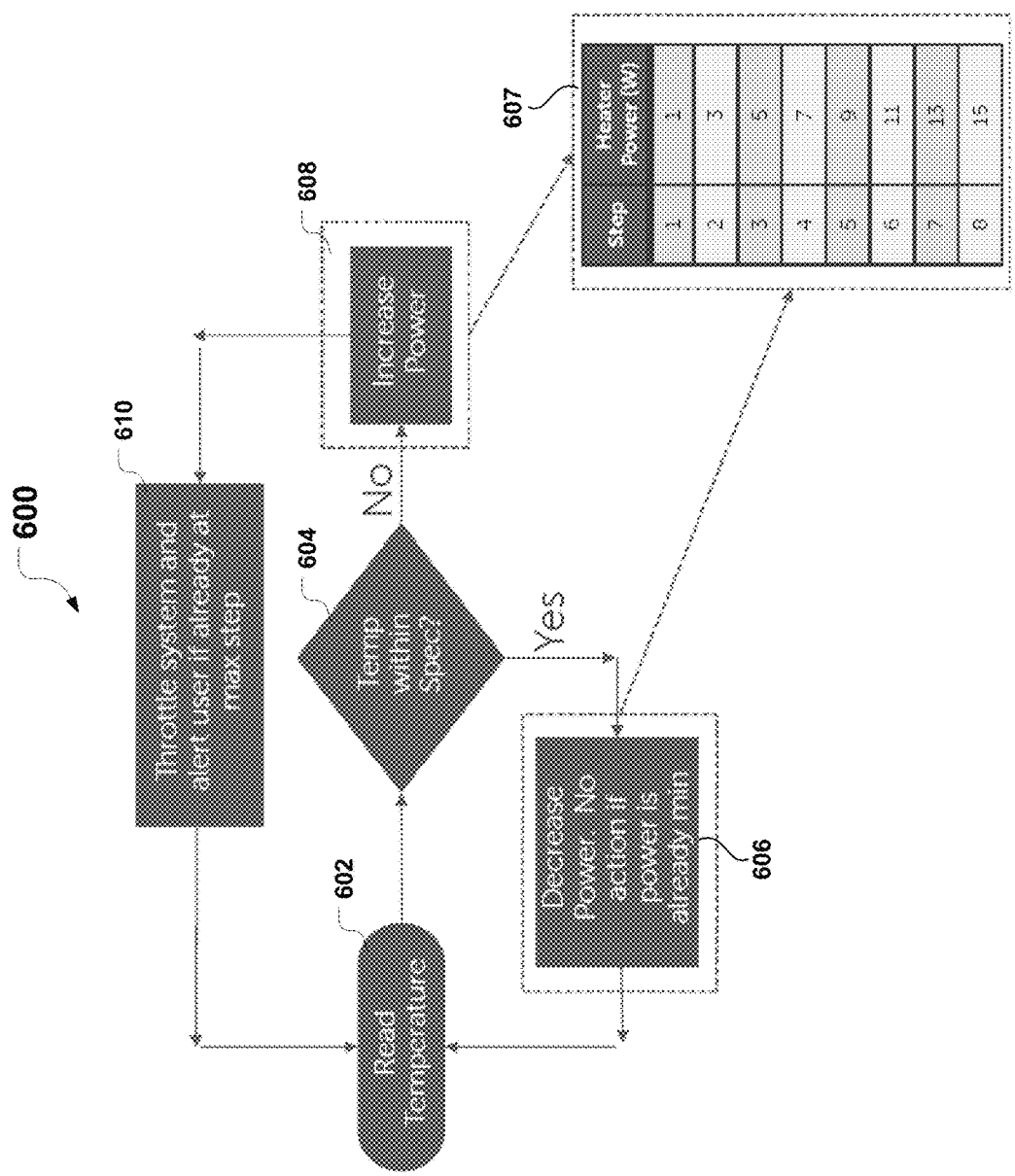
FIG. 6 is a flow chart illustrating an embodiment of a method for providing enhanced convective cooling.

Referring now to FIG. 6, an embodiment of a method 600 for providing enhanced convective cooling is illustrated. The method 600 begins at block 602 by reading a temperature of a cooled device. The temperature of the cooled device can be measured by a sensor interfaced with the cooled device and coupled to a controller that obtains an indication about the measured temperature from the sensor. In the embodiment of FIG. 2, the temperature sensor 206 measures a temperature of the cooled device 204 and provides an indication about the measured temperature to the controller 208 coupled to the convection enhancing heat element 212 via the power source 210. In the embodiment of FIG. 3, the temperature sensor 318 measures a temperature of the processing system 308 and provides an indication about the measured temperature of the processing system 308 to the controller 312 interfaced with the power source 314 and the convection enhancing heat element 310 (via the interface connection 316). In the embodiment of FIG. 4, the temperature sensor 426 measures a temperature of the processing system 412 and provides an indication about the measured temperature of the processing system 412 to the controller 420 interfaced with the power source 422 and the convection enhancing heat element 416 (via the interface connection 424). Alternatively, or additionally, the temperature sensor 428 measures a temperature of the processing system 418 and provides an indication about the measured temperature of the processing system 418 to the controller 420 interfaced with the power source 422 and the convection enhancing heat element 416 (via the interface connection 424).

The method 600 then proceeds to block 604 where the decision occurs whether the temperature of the cooled device measured by the temperature sensor and provided to the controller has exceeded a threshold. The controller coupled to the cooled device (via the temperature sensor) is configured to determine whether a temperature of the cooled device has exceeded the threshold. In the embodiment of FIG. 2, the controller 208 can determine whether the temperature of the cooled device 204 has exceeded the threshold, based on the indication about the temperature of the cooled device 204 provided by the temperature sensor 206. In the embodiment of FIG. 3, the controller 312 can determine whether the temperature of the processing system 308 has exceeded the threshold, based on the indication about the temperature of the processing system 308 provided by the temperature sensor 318. In the embodiment of FIG. 4, the controller 420 can determine whether the temperature of the processing system 412 has exceeded the threshold, based on the indication about the temperature of the processing system 412 provided by the temperature sensor 426. Alternatively, or additionally, the controller 420 may determine whether the temperature of the processing system 418 has exceeded the threshold, based on the indication about the temperature of the processing system 418 provided by the temperature sensor 428.

If, at block 604 it is determined that the temperature of the cooled device has not exceeded a threshold, the method 600 then proceeds to block 606 where a power of the convection enhancing heat element is decreased. Thus, since the temperature of the cooled device has not exceeded (or is no longer exceeding) the threshold, the power provided to the convection enhancing heat element may be decreased such that the convective airflow produced through the chassis housing of the enhanced convective cooling system is lowered. As can be seen no action in relation to the convection enhancing heat element is conducted if the power of the convection enhancing heat element is already at a lowest pre-defined level (e.g., zero power such that the convection enhancing heat producing element does not produce heat). As illustrated in FIG. 6, the power of the convection enhancing heat element may be decreased in discrete steps according to a convection enhancing heat element stepped power database 607. After decreasing the power of the convection enhancing heat element, the method 600 proceeds back to block 602 where a temperature of the cooled device is again acquired by the temperature sensor coupled to the cooled device, and provided to the controller for determination whether the temperature of the cooled device has exceeded a threshold (e.g., at block 604).

In the embodiment of FIG. 2, the controller 208 may determine that the measured temperature of the cooled device 204 has not exceeded the threshold and, in response, control the power source 210 such that the power supplied to the convection enhancing heat element 212 from the power source 210 is decreased. Thus, since the temperature of the cooled device 204 has not exceeded the threshold, the convective airflow directed through the chassis 202 can be decreased. If the power of the convection enhancing heat element 212 is already at a lowest pre-defined level, then no action in relation to power level of the convection enhancing heat element 212 is conducted. The controller 208 may continue to monitor a temperature of the cooled device 204 by reading (e.g., at pre-defined time instants) indications of the temperature of the cooled device 204 acquired by the temperature sensor 206, and control, based on the temperature of the cooled device 204, a power supplied to the convection enhancing heat element 212 from the power source 210.

In the embodiment of FIG. 3, the controller 312 may determine that the measured temperature of the processing system 308 has not exceeded the threshold and, in response, control the power source 314 (via the interface connection 316) such that the power supplied to the convection enhancing heat element 310 from the power source 314 is decreased. Thus, since the temperature of the processing system 308 has not exceeded the threshold, the convective airflow directed from the airflow inlet 304 through the chassis 302 and past the processing system 308 and to the airflow outlet 306 can be decreased. If the power of the convection enhancing heat element 310 is already at a lowest pre-defined level, then no action in relation to power level of the convection enhancing heat element 310 is conducted. The controller 312 may continue to monitor a temperature of the processing system 308 by reading (e.g., at pre-defined time instants) indications of the temperature of the processing system 308 acquired by the temperature sensor 318, and control, based on the temperature of the processing system 308, a power supplied to the convection enhancing heat element 310 from the power source 314.

In the embodiment of FIG. 4, the controller 420 may determine that the measured temperature of the processing system 412 (and/or the measured temperature of the processing system 418) has not exceeded the threshold and, in response, control the power source 422 (via the interface connection 424) such that the power supplied to the convection enhancing heat element 416 from the power source 422 is decreased. Thus, since the temperature of the processing system 412 (and/or the temperature of the processing system 418) has not exceeded the threshold, a convective airflow directed from the airflow inlet 404 through the horizontal chassis portion 410 and past the processing system 412 to the vertical chassis portion 414 and to the airflow outlet 408 can be decreased, and/or another convective airflow directed from the airflow inlet 406 through the vertical chassis portion 414 and past the processing system 418 and to the airflow outlet 408 can be also decreased. If the power of the convection enhancing heat element 416 is already at a lowest pre-defined level, then no action in relation to a power level of the convection enhancing heat element 416 is conducted. The controller 420 may continue to monitor a temperature of the processing system 412 and/or a temperature of the processing system 418 by reading (e.g., at pre-defined time instants) indications of the temperature of the processing system 412 acquired by the temperature sensor 426 and/or indications of the temperature of the processing system 418 acquired by the temperature sensor 428, and control, based on the temperature readings, a power supplied to the convection enhancing heat element 416 from the power source 422.

If, at block 604 it is determined that the temperature of the cooled device has exceeded a threshold, the method 600 then proceeds to block 608 where a power of the convection enhancing heat element is increased. As discussed above, by increasing the power of the convection enhancing heat element, the convective airflow directed through the chassis housing of the enhanced convective cooling system and past the cooled device is increased, thus increasing heat dissipation from the cooled device. As illustrated in FIG. 6, the power of the convection enhancing heat element may be increased in discrete steps according to the convection enhancing heat element stepped power database 607.

In the embodiment of FIG. 2, the controller 208 may determine that the measured temperature of the cooled device 204 has exceeded the threshold and, in response, control the power source 210 to increase a power supplied to the convection enhancing heat element 212 from the power source 210. As discussed above, by increasing the power of the convection enhancing heat element 212, the convective airflow directed through the chassis 202 and past the cooled device 204 is increased, thus enhancing heat dissipation from the cooled device 204. In the embodiment of FIG. 3, the controller 312 may determine that the measured temperature of the processing system 308 has exceeded the threshold and, in response, control the power source 314 (via the interface connection 316) to increase a power supplied to the convection enhancing heat element 310 from the power source 314. As discussed above, by increasing the power of the convection enhancing heat element 310, the convective airflow directed through the airflow inlet 304, the chassis 302, and past the processing system 308 towards the airflow outlet 306 is increased, thus increasing heat dissipation from the processing system 308. In the embodiment of FIG. 4, the controller 420 may determine that the measured temperature of the processing system 412 (and/or the measured temperature of the processing system 418) has not exceeded the threshold and, in response, control the power source 422 (via the interface connection 424) to increase a power supplied to the convection enhancing heat element 416 from the power source 422. As discussed above, by increasing the power of the convection enhancing heat element 416, the convective airflow directed from the airflow inlet 404 through the horizontal chassis portion 410 and past the processing system 412 to the vertical chassis portion 414 and to the airflow outlet 408 is increased, and the other convective airflow directed from the airflow inlet 406 through the vertical chassis portion 414 and past the processing system 418 and to the airflow outlet 408 is also increased, thus increasing the heat dissipation from the processing system 412 and the processing system 418.

The method 600 then proceeds to block 610 where the enhanced convective cooling system may be throttled if the temperature of the cooled device has exceeded the threshold and the power of the convection enhancing heat element has already reached a highest pre-defined level. In addition, an alert may be sent to a user (e.g., an operator of the enhanced convective cooling system) to conduct appropriate operations with respect to the enhanced convective cooling system and the cooled device in order to establish correct functioning of the enhanced convective cooling system and the cooled device. Following the throttling of the cooled device, and/or once the correct functioning of the enhanced convective cooling system and the cooled device is established, the method 600 proceeds to block 602 where a temperature of the cooled device is measured and provided to the controller. In the embodiment of FIG. 2, the controller 208 may determine that the temperature of the cooled device 204 has exceeded the threshold and that the power supplied from the power source 210 to the convection enhancing heat element 212 is at a highest pre-defined level and, in response, throttle the enhanced convective cooling system 200 of FIG. 2. In addition, the controller 208 may be configured to alert a user (e.g., system operator) to conduct appropriate operations with respect to the enhanced convective cooling system 200 and the cooled device 204 in order to establish correct functioning of the enhanced convective cooling system 200 and the cooled device 204. Following the throttling of the cooled device 204, and/or once the correct functioning of the enhanced convective cooling system 200 and the cooled device 204 is established, the controller 208 continues to monitor a temperature of the cooled device 204 by communicating with the temperature sensor 206.

In the embodiment of FIG. 3, the controller 312 may determine that the temperature of the processing system 308 has exceeded the threshold and that the power supplied from the power source 314 to the convection enhancing heat element 310 is at a highest pre-defined level and, in response, throttle the IHS cooling system 300 of FIG. 3. In addition, the controller 312 may be configured to alert a user (e.g., system operator) to conduct appropriate operations with respect to the IHS cooling system 300 and the processing system 308 in order to establish correct functioning of the IHS cooling system 300 and the processing system 308. Following the throttling of the processing system 308, and/or once the correct functioning of the IHS cooling system 300 and the processing system 308 is established, the controller 312 continues to monitor a temperature of the processing system by communicating with the temperature sensor 318. In the embodiment of FIG. 4, the controller 420 may determine that the temperature of the processing system 412 (and/or the temperature of the processing system 418) has exceeded the threshold and that the power supplied from the power source 422 to the convection enhancing heat element 416 is at a highest pre-defined level and, in response, throttle the IHS cooling system 400 of FIG. 4. In addition, the controller 420 may be configured to alert a user (e.g., system operator) to conduct appropriate operations with respect to the IHS cooling system 400 and the processing systems 412, 416 in order to establish correct functioning of the IHS cooling system 400 and the processing systems 412, 416. Following the throttling of the processing systems 412, 416, and/or once the correct functioning of the IHS cooling system 400 and the processing systems 412, 416 is established, the controller 420 continues to monitor a temperature of the processing system 412 (and/or the processing system 416) by communicating with the temperature sensor 426 (and/or the temperature sensor 428).

Figure 7:
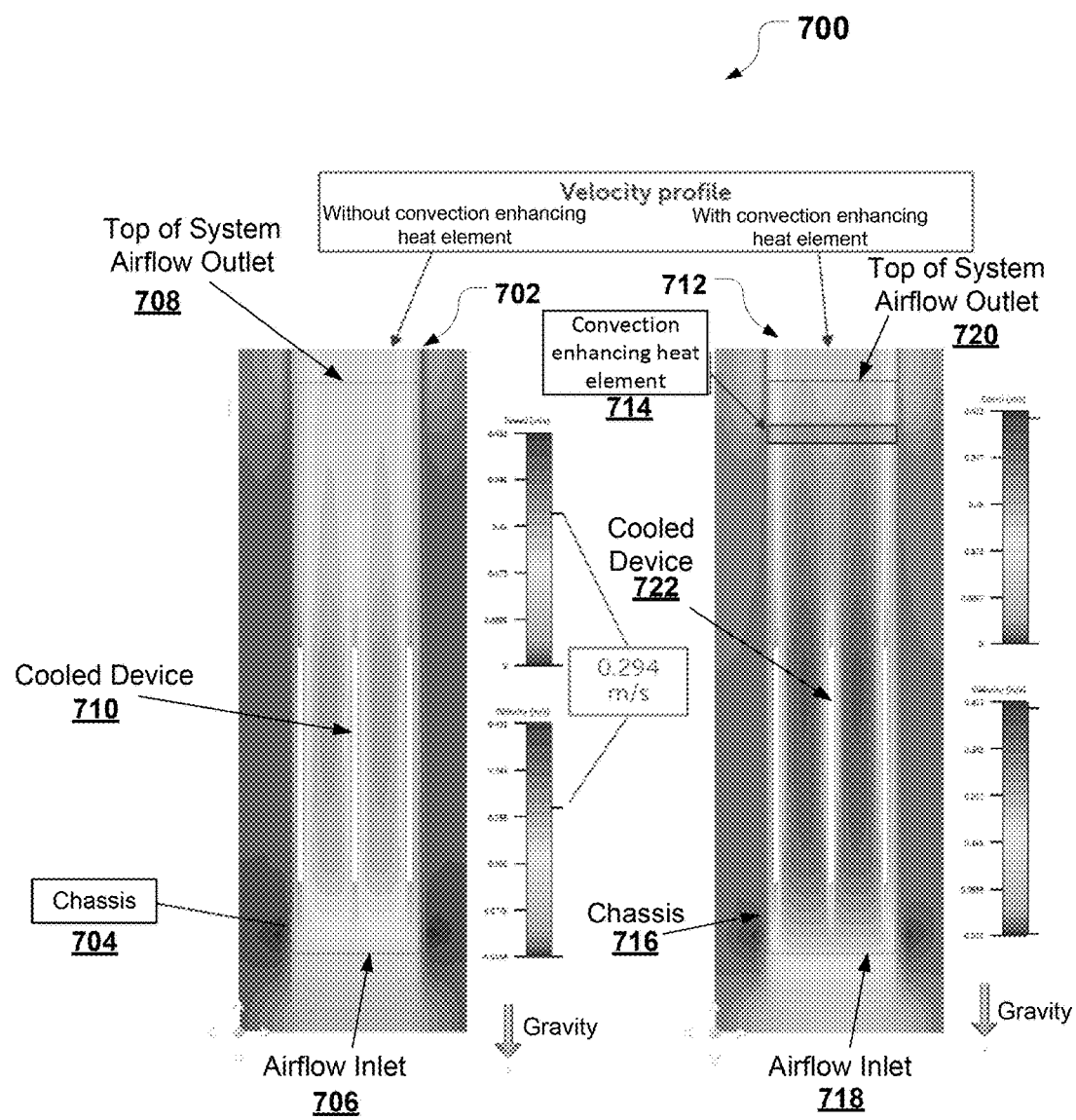
FIG. 7 is a heat graph illustrating embodiments of airflow velocity in an IHS cooling system with and without a convection enhancing heat element.

Referring now to FIG. 7, a comparative heat graph 700 produced during experimental embodiments of the present disclosure that illustrates airflow velocity in an IHS cooling system with and without a convection enhancing heat element is provided according to the teachings of the present disclosure. The IHS cooling system graph 702 illustrated in FIG. 7 represents a natural convection cooling system without a convection enhancing heat element. For example, in different embodiments, the IHS cooling system 702 may correspond to the IHS cooling system 300 of FIG. 3 where the convection enhancing heat element 310 is removed or disabled, or the IHS cooling system 400 of FIG. 4 where the convection enhancing heat element 416 is removed or disabled. The IHS cooling system graph 702 allows the visualization of a chassis 704 that defines an airflow channel along its length and that includes an airflow inlet 706 and an airflow outlet 708 that is located opposite the chassis 704 from the airflow inlet 706. The IHS cooling system graph 702 also allows the visualization of a cooled device (e.g., a heat producing component) 710 that is housed in the chassis 704 and located in the airflow channel. As discussed above, the natural convection airflow against gravity is directed through the airflow inlet 706, the chassis 704 and past the cooled device 710 towards the airflow outlet 708, thus moving the heat produced by the heat producing component away from the heat producing component. For the experimental embodiment that provided the IHS cooling system graph 702 in FIG. 7, the largest achieved velocity of airflow directed through the chassis 704 and past the cooled device 710 was 0.294 m/s.

The IHS cooling system graph 712 illustrated in FIG. 7 represents an enhanced convective cooling system where a convection enhancing heat element 714 is incorporated. For example, in different embodiments, the IHS cooling system graph 712 may correspond to the IHS cooling system 300 of FIG. 3 with the convection enhancing heat element 714 corresponding to the convection enhancing heat element 310, or the IHS cooling system graph 712 may correspond to the IHS cooling system 400 of FIG. 4 with the convection enhancing heat element 714 corresponding to the convection enhancing heat element 416. The IHS cooling system graph 712 allows the visualization of a chassis 716 that defines an airflow channel along its length and that includes an airflow inlet 718 and an airflow outlet 720 that is located opposite the chassis 716 from the airflow inlet 718. The IHS cooling system graph 712 also allows the visualization of a cooled device (e.g., a heat producing component) 722 that is housed in the chassis 716 and located in the airflow channel. As discussed above, the increase of heat generated by the convection enhancing heat element 714 increases a naturally convective airflow that is directed through the chassis 716 and past the cooled device 722, as a density of air in a vicinity of the convection enhancing heat element 714 is decreased through an increase in temperature that is a result of heat transferred from the convection enhancing heat element 714 to the air, and that lower density heated air in the vicinity of the convection enhancing heat element 714 will then rise against gravity due to buoyancy forces, thus increasing the heat dissipation from the cooled device (heat producing component) 722. Such enhanced convective cooling is able to produce enhanced heat transfer that is proportionate to the temperature (and thus fluid density) differential between the convection enhancing heat element 714 and a cooler (and thus higher density) air at the airflow inlet 718 of the chassis 716. For the experimental embodiment that provided the IHS cooling system graph 712, the airflow (heat transfer) was enhanced and the largest achieved velocity of airflow directed through the chassis 716 and past the cooled device 722 was 0.434 m/s (corresponding to a highest supported power level of the convection enhancing heat element 714), which is an increase in airflow velocity of more than 47% in comparison with the IHS cooling system graph 702 that did not involve a convection enhancing heat element.

As discussed above, the velocity of airflow directed through the chassis 716 and past the cooled device 722 can be controlled based on a power supplied to the convection enhancing heat element 714 from a power source coupled to the convection enhancing heat element 714. In experimental embodiments illustrated in FIG. 7, the temperature of the cooled device 722 in the enhanced convective cooling system that received the largest velocity of airflow directed through the chassis 716 (e.g., the airflow velocity of 0.434 m/s discussed above) was reduced to 84.21° C., whereas the temperature of the cooled device 710 in the natural convection cooling system that received the largest velocity of airflow directed through the chassis 704 (e.g., the airflow velocity of 0.294 m/s discussed above) was reduced to 91.41° C. As such, a decrease of the temperature of the heat producing component of more than 7° C. was achieved by employing the convection enhancing heat element 714 in the enhanced convective cooling system 712. In experimental embodiments illustrated in FIG. 7, the thermal resistance of the natural convection cooling system (corresponding to the largest velocity of airflow directed through the chassis 704) was equal to 66.41 [degree/Watt], whereas the thermal resistance of the enhanced convective cooling system 712 (corresponding to the largest velocity of airflow directed through the chassis 716) was equal to 59.21 [degree/Watt]. As such, a decrease of the thermal resistance of approximately 28% was achieved by employing the convection enhancing heat element 714 in the enhanced convective cooling system 712.

Thus, systems and methods have been described that provide a convection enhancing heat element located between cooled device(s) and an airflow outlet that, when activated to produce heat, enhance the convective airflow through a chassis in order to provide enhanced convective cooling to the cooled devices. The systems and methods of the present disclosure increase the convective cooling that is typically limited by the temperature of the component being cooled relative to the temperature of the inlet air by providing a heat element that may reach a temperature that is higher than that of the component being cooled. As such, cooled devices that have relatively high cooling requirements may be cooled via convection and without the use of fan devices that increase power consumption, noise, and maintenance requirements of the system. In specific embodiments, relatively small Internet of Things (IOT) devices may utilize the systems and methods described herein to provide small, fan-less devices with relatively powerful heat producing processors that may be cooled sufficiently to operate at desired levels. Furthermore, the chassis in which the cooled device(s) and the convection enhancing heat element may be dimensioned and/or otherwise designed to optimize the convective airflow produced through the chassis when the convection enhancing heat element is activated.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An airflow control system, comprising:
   a chassis defining a chassis housing that includes at least one airflow inlet and an airflow outlet;
   a cooled device located in the chassis housing between the at least one airflow inlet and the airflow outlet;
   a convection enhancing heat element located in the chassis housing between the cooled device and the airflow outlet, wherein the convection enhancing heat element is configured to produce temperatures that are higher than temperatures produced by the cooled device when activated; and
   a controller that is coupled to the convection enhancing heat element and configured to activate the convection enhancing heat element such that a convective airflow through the chassis housing is increased.

2. The airflow control system of claim 1, wherein the convection enhancing heat element is located gravitationally above the cooled device during system operations.

3. The airflow control system of claim 1, wherein the controller is coupled to the cooled device and configured to determine whether a temperature of the cooled device has exceeded a threshold, and wherein the activation of the convection enhancing heat element is performed in response to the temperature of the cooled device exceeding the threshold.

4. The airflow control system of claim 3, further comprising:
   a sensor that is located in the chassis housing and configured to indicate the temperature of the cooled device.

5. The airflow control system of claim 1, wherein the chassis includes a first chassis portion having a first airflow inlet and housing the cooled device, and a second chassis portion having a second airflow inlet and housing the convection enhancing heat element, wherein the first chassis portion provides a substantially horizontal airflow channel and the second chassis portion provides a substantially vertical airflow channel during system operations.

6. The airflow control system of claim 1, further comprising:
   a heat sink located in the chassis housing, wherein the cooled device is mounted to the heat sink.

7. An information handling system (IHS) cooling system, comprising:
   a chassis defining an airflow channel that includes an inlet and an outlet;
   a processing system housed in the chassis and located in the airflow channel;
   a convection enhancing heat element housed in the chassis and positioned opposite the processing system from the inlet of the airflow channel, wherein the convection enhancing heat element is configured to produce temperatures that are higher than temperatures produced by the processing system when activated; and
   a controller that is coupled to the processing system and the convection enhancing heat element, wherein the controller is configured to:
   receive a temperature of the processing system;
   determine the temperature of the processing system exceeds a threshold; and
   activate the convection enhancing heat element such that a convective airflow through the airflow channel is increased.

8. The IHS cooling system of claim 7, wherein the convection enhancing heat element is located gravitationally above the processing system during IHS operations.

9. The IHS cooling system of claim 7, further comprising:
   a power source coupled to the controller and the convection enhancing heat element, wherein the controller is configured to activate the convection enhancing heat element by enabling power from the power source to the convection enhancing heat element.

10. The IHS cooling system of claim 7, further comprising:
    a sensor that is coupled to the controller and configured to indicate the temperature of the processing system to the controller.

11. The IHS cooling system of claim 9, wherein the chassis includes a first chassis portion having a first airflow inlet and housing the processing system, and a second chassis portion having a second airflow inlet and housing the convection enhancing heat element, wherein the first chassis portion provides a substantially horizontal airflow channel and the second chassis portion provides a substantially vertical airflow channel during IHS operations.

12. The IHS cooling system of claim 7, further comprising:
a heat sink housed in the chassis, wherein the processing system is mounted to the heat sink.

13. A method for airflow control, comprising:
operating, by a cooled device that is located in a chassis housing that includes at least one airflow inlet and an airflow outlet, such that heat is produced;
monitoring, by a controller, the cooled device to determine whether a temperature of the cooled device has exceeded a threshold;
activating, by the controller in response to the temperature of the cooled device exceeding the threshold, a convection enhancing heat element that is located between the cooled device and the airflow outlets; and
producing, by the convection enhancing heat element, temperatures that are higher than temperatures produced by the cooled device when activated, wherein the activation of the convection enhancing heat element increases a convective airflow that is directed through the chassis housing and past the cooled device.

14. The method of claim 13, wherein the convection enhancing heat element is located gravitationally above the cooled device during the activation of the convection enhancing heat element.

15. The method of claim 13, further comprising:
indicating, by a sensor that is coupled to the controller, the temperature of the cooled device.

16. The method of claim 13, wherein the chassis housing includes a first chassis portion having a first airflow inlet and housing the cooled device, and a second chassis portion having a second airflow inlet and housing the convection enhancing heat element, wherein the first chassis portion provides a substantially horizontal airflow channel and the second chassis portion provides a substantially vertical airflow channel during the activation of the convection enhancing heat element.

17. The method of claim 13, wherein the cooled device is mounted to a heat sink located in the chassis housing.

* * * * *

UNITED STATES PATENT AND TRADEMARK OFFICE
CERTIFICATE OF CORRECTION

PATENT NO. : 10,133,325 B2
APPLICATION NO. : 15/009536
DATED : November 20, 2018
INVENTOR(S) : Christopher Michael Helberg et al.

Page 1 of 1

It is certified that error appears in the above-identified patent and that said Letters Patent is hereby corrected as shown below:

In the Claims

In Claim 13, Column 17, Line 19: replace "outlets" with --outlet--

Signed and Sealed this
Thirtieth Day of July, 2019

Andrei Iancu
*Director of the United States Patent and Trademark Office*